(12) United States Patent  
Rojko (10) Patent No.: US 12,276,707 B2  
(45) Date of Patent: Apr. 15, 2025

(54) SELF-DIAGNOSTIC METHOD OF OPEN-CIRCUIT FAULTS, COMPUTERIZED SURVEY SYSTEM, AND MODULAR INVERTER

(71) Applicant: MITSUBISHI ELECTRIC CORPORATION, Tokyo (JP)

(72) Inventor: Andreja Rojko, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 109 days.

(21) Appl. No.: 17/924,043

(22) PCT Filed: Apr. 16, 2021

(86) PCT No.: PCT/JP2021/017314  
§ 371 (c)(1),  
(2) Date: Nov. 8, 2022

(87) PCT Pub. No.: WO2021/251030  
PCT Pub. Date: Dec. 16, 2021

(65) Prior Publication Data  
US 2023/0176142 A1 Jun. 8, 2023

(30) Foreign Application Priority Data

Jun. 11, 2020 (EP) .................................. 20305639

(51) Int. Cl.  
*G01R 31/26* (2020.01)  
*G01B 7/14* (2006.01)  
(Continued)

(52) U.S. Cl.  
CPC ............. *G01R 31/54* (2020.01); *G01R 31/42* (2013.01); *H02M 1/327* (2021.05)

(58) Field of Classification Search  
CPC ........ G01R 31/02; G01R 31/26; G01R 31/28; G01R 31/40; G01R 31/42; G01R 31/54; H02M 1/32; G01B 7/14; G01B 7/30  
See application file for complete search history.

(56) References Cited

U.S. PATENT DOCUMENTS

2013/0147407 A1* 6/2013 Kawamura ............. H02P 29/68  
    374/102  
2013/0320903 A1* 12/2013 Aalund ............... H02P 29/0241  
    318/490

(Continued)

OTHER PUBLICATIONS

Deng et al., "Fault Detection and Localization Method for Modular Multilevel Converters", IEEE Transactions on Power Electronics, Institute of Electrical and Electronics Engineers, USA, May 1, 2015, vol. 30, No. 5, pp. 2721-2732.

(Continued)

*Primary Examiner* — Neel D Shah  
(74) *Attorney, Agent, or Firm* — Birch, Stewart, Kolasch & Birch, LLP (57) ABSTRACT

Self-diagnostic method (100) of open-circuit fault, in power switching blocks of a modular inverter comprising a plurality (k=1 . . . n) of blocks (31a, 32a, 33a, 34a, 31b, 32b, 33b, 34b, 31c, 32c, 33c, 34c) in parallel per phase leg (5, 5a, 5b, 5c), and being provided with temperature sensors (6), said method comprising: —sampling and storing (130) temperatures data (I) of said n blocks in a phase leg measured by said (Continued)

temperature sensors at relevant sampling times $t_{SD}$ with a relevant sampling interval $\Delta t_{SD}$; —comparing (150) said temperature data (I) of each (k) block with previously sampled and stored temperature data (II) of said each (k) block and considering a possible fault (FF) on one of said blocks if the following condition is not fulfilled: (III) where Th is a predefined temperature deviation threshold; or —comparing (250) current temperature data (I) of each (k) block with current average temperature data (VI) and considering a fault (OF) on one of said blocks if the following condition is not fulfilled: (V) where $Th_{AV}$ is a predefined average temperature deviation threshold. The invention concerns also a test comprising a shoot-through procedure to identify open circuits in a block.

15 Claims, 5 Drawing Sheets

(51) Int. Cl.
  *G01B 7/30* (2006.01)
  *G01R 31/42* (2006.01)
  *G01R 31/54* (2020.01)
  *H02M 1/32* (2007.01)

(56) References Cited

U.S. PATENT DOCUMENTS

| | | | |
|---|---|---|---|
| 2014/0027089 A1* | 1/2014 | Hisada | B60L 3/0061 |
| | | | 165/11.1 |
| 2015/0084570 A1* | 3/2015 | Hara | B62D 5/0484 |
| | | | 318/494 |
| 2017/0259695 A1* | 9/2017 | Ishikawa | B60W 50/0225 |
| 2018/0154887 A1* | 6/2018 | Murata | H02P 29/68 |
| 2019/0067932 A1* | 2/2019 | Li | H02H 3/202 |

OTHER PUBLICATIONS

Haghnazari et al., "A New Fault Detection Method for Modular Multilevel Converter Semiconductor Power Switches", IECON 2015—41st Annual Conference of the IEEE Industrial Electronics Society, IEEE, Nov. 9, 2015, pp. 50-55.
International Search Report for PCT/JP2021/017314 (PCT/ISA/210) mailed on Aug. 23, 2021.
Written Opinion of the International Searching Authority for PCT/JP2021/017314 (PCT/ISA/237) mailed on Aug. 23, 2021.

* cited by examiner

SELF-DIAGNOSTIC METHOD OF OPEN-CIRCUIT FAULTS, COMPUTERIZED SURVEY SYSTEM, AND MODULAR INVERTER

TECHNICAL FIELD

The present disclosure concerns an open-circuit self-diagnostic method for modular general purpose inverters.

BACKGROUND ART

Inverters are used to feed AC motors in many applications. An open-circuit fault of one of the semiconductor switches in an inverter will cause disruption of the inverter operation. This will reflect in distortion of the output current waveform of the phase that is generated by the part of inverter circuit with open-circuit fault. Further this will cause a partial loss of the motor torque and can cause secondary failures of the system comprising the inverter and the motor.

Open-circuit fault of one switch in an inverter is not obvious since the motor fed by the faulty inverter will still continue to operate although with a reduced performance. Therefore, a dedicated open-circuit diagnostic method is necessary to detect, identify and locate open-circuit faults. A number of open-circuit diagnostic methods have been developed. Most of the methods are based on measurements of the output currents in legs of the inverter which are anyway measured for control purposes. Those methods exploit the fact that the output currents of the inverter with open-circuit fault are not symmetric anymore. Some other diagnostic methods require an additional dedicated circuit and/or additional sensors and are thus not suitable for cost-sensitive applications.

Instead of classical multi-phase inverter a modular inverter such as a General Purpose Inverter (GPI) with a modular architecture can be utilized. The modular architecture improves GPI's general fault tolerance and enables simple repair by replacing a faulty block. In a modular GPI each phase leg is composed of multiple parallel connected half-bridges. Each half-bridge comprises an upper switch and a lower switch and forms one inverter block that can be replaced in the case of a fault. Therefore, beside detection and identification of the fault also localization of a faulty block is necessary. Obviously, any combination of power modules, integrating any number of power dies, can form an inverter block provided that they facilitate modularity and their replacement.

Open-circuit fault in one block of the modular inverter will not result in disruption of the inverter functionality. The normal output current waveforms/voltage will still be maintained by other functioning blocks that are connected in parallel to the faulty block. Since there will be no loss of the current's symmetry, the prior-art open-circuit diagnostic methods based on the current symmetry are not applicable to the modular inverters. There will be no immediate effect of limited open-circuit faults on the inverter functionality, limited fault means that there is at least one healthy block in each phase leg, since there will be no loss of the motor torque. However, the open-circuit fault may result in overload of the taking-over blocks and consequently in the secondary failures. Thus also for modular inverters, an open-circuit diagnostics method is necessary. Only after accurately detecting, identifying fault and localizing the faulty block the user can be given all necessary information to repair the modular inverter.

However, prior-art open-circuit fault detection methods are either not transferable to modular inverters or GPIs or they need additional sensors/circuits which are to be avoided for cost effectiveness. Open-circuit fault of one or both switches in a block needs to be detected, identified and the faulty block needs to be localized. The detection of fault has to be reliable and the localizations accurate.

SUMMARY OF INVENTION

The present disclosure concerns an open-circuit fault self-diagnosis method that is applicable to modular inverters or general purpose inverters (GPI), which provides detection of fault in a switch and more precisely open circuit fault detection, identification and localization. The present disclosure provides a method that uses only data from sensors that are included for other purposes. No dedicated fault detection sensors or additional dedicated circuits are needed and the fault detection process runs continuously when the modular inverter is operating and does not disrupt its operation.

More precisely the present disclosure concerns a self-diagnostic method of open-circuit faults, in power switching blocks of a modular inverter comprising a plurality ($k=1 \ldots n$) of blocks paralleled in a phase leg, and being provided with temperature sensors, said method comprising a first loop comprising:
  sampling and storing temperatures data $T_k^p$ of said n blocks ($k=1 \ldots n$) in a phase leg measured by said temperature sensors at relevant sampling times $t_{SD}$ with a relevant sampling interval $\Delta t_{SD}$;
  at least one step of comparing current temperature data $T_k^p$ of a block k with current average temperature data $$\left(\frac{1}{n-1}\sum_{i=1}^{n} T_i^p\right)$$

of all other blocks of said phase leg at sampling time $t_{SD}^P$, considering said block k as an open circuit block kf and raising an open-circuit fault flag OF on said open circuit block kf if the following condition is not fulfilled:

$$T_k^p \in \left[\left(\frac{1}{n-1}\sum_{i=1}^{n} T_i^p\right) \pm Th_{AV}\right], i \neq k$$

where $Th_{AV}$ is a predefined average temperature deviation threshold.

This method permits to warn of potential fault on a block having a temperature differing for more than a predefined average temperature deviation threshold from the average temperature of the other paralleled blocks The following embodiments may be put into practice independently from each other or combined:

In a first embodiment, said step of comparing current temperature data $T_k^p$ of a block k with current average temperature data may be done on blocks k=1 to n until a fault flag OF is raised on a faulty block kf.

This is adapted to control systems having powerful calculation means and a memory large enough to store all the blocks temperature data and compute such.

In a second embodiment, the method may comprise a second loop embedded in said first loop, said second loop comprising, at sampling time $t_{SD}^P$ comparing said temperature data $T_k^p$ of each block k with previously sampled and stored temperature data $T_k^{p-1}$ of said each block k and raising a possible fault flag FF on a faulty block kf if the following condition is not fulfilled:

$$T_k^p \in [T_k^{p-1} \pm Th]$$

where Th is a predefined temperature deviation threshold. In such case, said comparing current temperature data $T_k^p$ of a block k with current average temperature data $$\left( \frac{1}{n-1} \sum_{i=1}^{n} T_i^p \right)$$

of other blocks in said phase leg, considering said block k as an open circuit block kf and raising an open-circuit fault flag OF on said open circuit block kf if the following condition is not fulfilled:

$$T_k^p \in \left[ \left( \frac{1}{n-1} \sum_{i=1}^{n} T_i^p \right) \pm Th_{AV} \right], i \neq k$$

where $Th_{AV}$ is a predefined average temperature deviation threshold is done on said potentially faulty block kf.

This embodiment requires less powerful calculation means as the test comparing the block temperature with mean value of other blocks temperature is done only on a block which has a temperature already considered as abnormal.

This second embodiment can also be used as a routine test since the comparison with average data is done only in case of detection of a potentially faulty block by the second loop. In such case, the first embodiment can also be used at specific moments in the inverter life.

The method may also comprise a third loop of awaiting a stable operating point before comparing said sampled temperature $(T_k^p)$ of each (k) block (k=1 . . . n) at a sampling time $t_{SD_k}^p$ with the temperature $(T_k^{p-1})$ of a same (k) block at a previous sampling time $t_{SD_k}^{p-1}$ as said stable operating point.

This third loop reduces the calculation load for the controller of the inverter and may avoid possible false detections.

For the first embodiment, in case $T_k^p \in [T_k^{p-1} \pm Th]$ is fulfilled for blocks k=1 to n the method may comprise waiting a defined $\Delta t_{SD}$ and repeating said first loop.
For the second embodiment, in case $$T_k^p \in \left[ \left( \frac{1}{n-1} \sum_{i=1}^{n} T_i^p \right) \pm Th_{AV} \right], i \neq k$$

is fulfilled for block kf the method may comprise waiting $\Delta t_{SD}$ and repeating said first loop.

The method may also comprise an initialization process wherein initial temperature values $(T_k^0, k=1 \ldots n)$ are measured and stored for all n blocks that are paralleled in said phase leg (5) after power-up of the modular inverter or after a predefined time interval after powering-up of the modular inverter or in special time period dedicated to the modular inverter fault self-detection.

This sets initial conditions for the detection.

To limit memory usage, the method may comprise deleting previous temperature data stored at a sampling time $t_{SD_k}^{p-2}$ while storing $T_k^p$ temperature values.

The sampling interval $\Delta t_{SD}$ may be set as being greater than the largest thermal time constant of relevant thermal time constants in the modular inverter blocks.

The method may also comprise calibration procedures to determine a suitable sampling interval $\Delta t_{SD}$, and/or temperature deviation threshold Th and/or average temperature deviation threshold $Th_{AV}$ and may comprise an initialisation procedure with said sampling interval $\Delta t_{SD}$, temperature deviation threshold Th and average temperature deviation threshold $Th_{AV}$.

Those values are determined in view of the types of blocks or modules in the inverters. $\Delta t_{SD}$ may also be set as being larger than the temperature constant of the block and be set as a compromise between detection speed and calculation load of the controller and adapted during life of the inverter.

In a preferred embodiment, said blocks comprising a top switch and a bottom switch and shoot-through sensing means for each of said switches, said open circuit fault detection procedure may then comprise identifying and localizing the fault through triggering a shoot-through test by driving to on-state both top switch and bottom switch of a block on which an open circuit flag OF is raised with a drive circuit of said block for a duration longer than the commutation time of the switches, but within the safe operating area of said switches, and, testing presence of shoot-through current and raising a confirmed open circuit fault flag OFC on said one of said blocks in case no shoot-through current is detected.

This allows a complete diagnosis of open circuit fault. The safe operating area is defined for each device in its data sheet and the shoot-through duration is defined to remain small versus the safe operating area, e.g. within the microsecond range or tenth of microsecond range.

In case shoot through current is detected when testing presence of shoot-through current, other diagnostic procedures are initiated.

The method may be repeated for each leg of said converter.

The method may comprise transmitting fault detection information FF and/or OF, and/or OFC to a remote survey computer.

The present disclosure concerns also a computerized survey system for implementing the self-diagnostic method discussed hereabove and comprising a processor, program memory comprising programs implementing said method, data memory for storing and processing temperature values, fault detection data and program data, connecting lines with said temperature sensors for transmitting temperature measurements to said computerized system.

In addition the computerized survey system may comprise connecting lines with said shoot-through detection means and control lines connected with a drive block or drive blocks of the modular inverter.

Advantageously, the computerized survey system may be incorporated in a control unit of the modular inverter.

BRIEF DESCRIPTION OF DRAWINGS

A detailed description of exemplary embodiments of the invention will be discussed hereunder in reference to the attached drawings.

DESCRIPTION OF EMBODIMENTS

Figure 1:
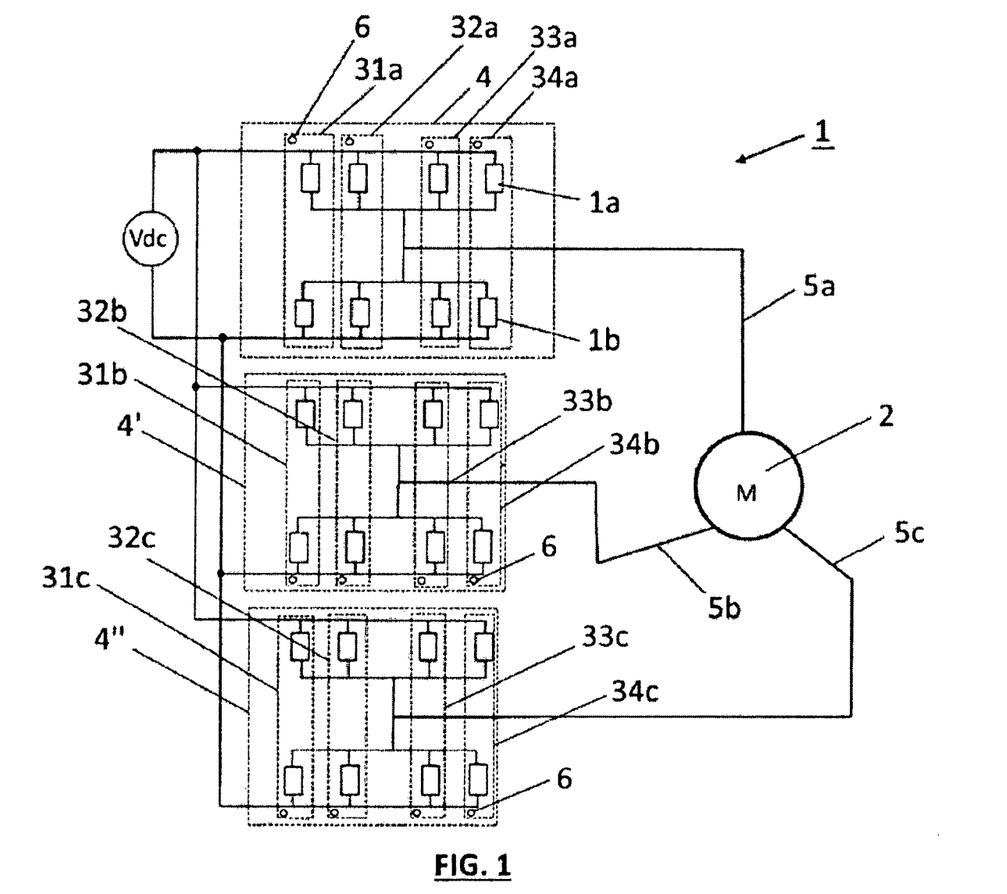
FIG. 1 is a schematic representation of an example of modular inverter to which the processes of the disclosure may apply.
Figure 2:
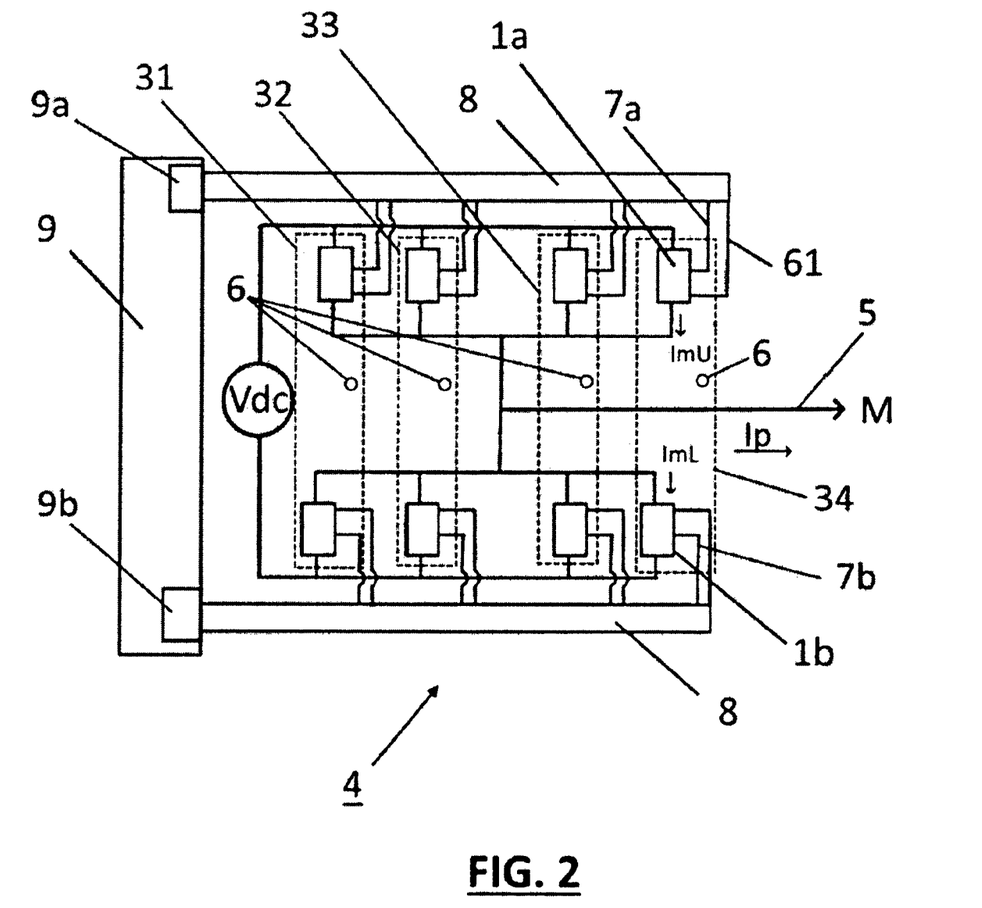
FIG. 2 is a detail of a branch of the modular inverter of FIG. 1.

FIG. 1 discloses an inverter 1 of the modular inverter type to drive a three phase motor 2. Modular inverters such as GPIs may have two or more blocks per phase leg but to simplify the drawing, the inverter described has four blocks or power branches 4, 4', 4" per phase leg to drive each of the three phase legs 5a, 5b, 5c driving the three phases motor 2. Phase leg 5a is composed by blocks 31a, 32a, 33a, 34a, leg 5b is driven by blocks 31b, 32b, 33b, 34b, phase leg 5c is driven by blocks 31c, 32c, 33c, 34c, each block or half bridge having a top switch 1a and a bottom switch 1b. In FIG. 2 is represented a power branch 4 of a phase leg 5 where top switch 1a, and bottom switch 1b of each blocks 31, 32, 33, 34 comprise command lines 7a, 7b connected to gate drivers 9a, 9b in a controller 9 through a bus 8. The procedure of the disclosure uses temperature sensing devices which are provided in each block to senses the power loss in the whole block. Usually one sensor is located in a corner of each block. The temperature sensing devices 6 are connected to the controller through lines 61 and the bus 8.

In the present design, each block 31, 32, 33, 34 is provided with a temperature sensing device 6 included for purposes such as detecting over-temperature condition. Back to FIG. 1, all the blocks 31a, ..., 34a, 31b, ..., 34b, 31c, ..., 34c of all power branches 4, 4', 4" are equipped with such temperature sensors 6. In addition, each switch 1a, 1b is driven by its gate command line 7a, 7b.

The self-diagnostic method of the present disclosure detects, identifies and localizes open-circuit faults in modular inverters by individually addressing each constitutive half-bridge in each inverter phase. This is executed by promoting shoot-through current trough the half-bridge and verifying that both the top and bottom switches are desaturated. The absence of desaturation in either switch indicates open circuit fault. This procedure can be executed either periodically or triggered by using any other relevant fault indicator such as temperature evolution. This test is capable in equal measure to detect fault in the associated gate driver though it cannot discriminate between fault in switch or gate driver.

The diagnostic method is executed separately and independently on each phase leg 5 of the modular inverter that is on each power branch 4, 4' and 4" of said phase leg.

During the operation of healthy modular inverters, each block will provide a current ImU in the top switch and ImL in the bottom switch and the current Ip of a specific phase will be almost equally distributed between all paralleled blocks in that phase leg. The power losses and consequently the temperatures of all paralleled blocks will be almost equal.

In the case of an open-circuit fault of a switch in one specific block, the faulty switch will not conduct current anymore. Therefore, the power loss in that specific block will be different than in the healthy state. Because of different power loss also the temperature of the faulty block will be different from average temperature of other, healthy parallel blocks of that phase.

Thus, if at a nominal operating point in a specific phase leg the temperature of a specific block differs from the temperature of other parallel blocks for more than a predefined average temperature deviation threshold this means that there is a fault in that specific block.

Next it has to be confirmed that the detected fault is an open-circuit fault.

In order to confirm whether the fault is an open circuit fault type, the method disclosed hereunder uses desaturation sensing means such as desaturation protection circuit present for each switch or other means of detecting shoot through current such as a current sense resistor.

The method comprises initiating a controlled shoot-trough by the controller 9 on the drive circuits 7a, 7b (gate drivers) of the concerned block and detecting presence or absence of desaturation as the normal result of such shoot through is desaturation of the switches.

To detect desaturation, power converters may be provided with one desaturation detection circuit for each switch in a block and/or one current sense resistor for each half-bridge.

Figure 5:
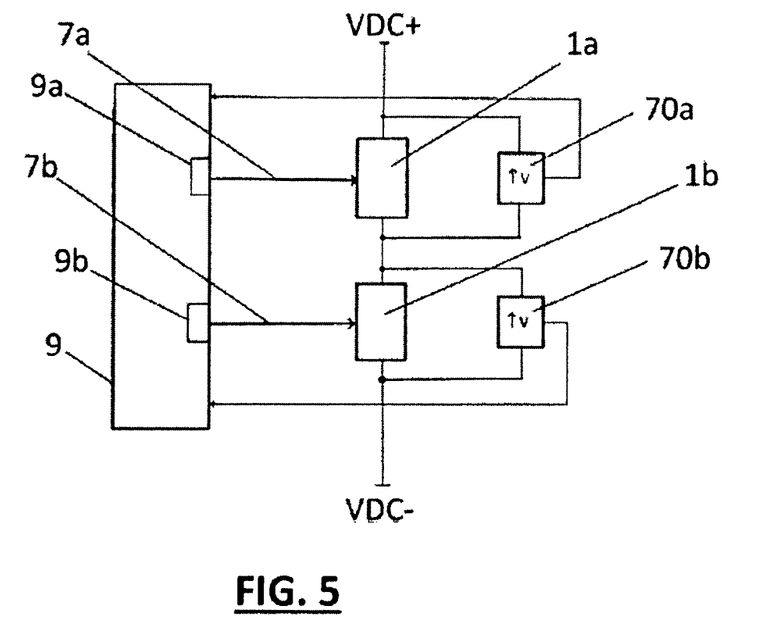
FIG. 5 is a schematic view of a converter block with desaturation detection means.

FIG. 5 is a schematic view of a block having desaturation sensing means 70a, 70b where desaturation sensing utilizes the switch 1a, 1b (IGBT, MOSFET or other) itself as the current measurement component. In a normal operation the collector-emitter or drain-source voltage is very low as the switch is saturated. However if a short-circuit event occurs, leading to excessive switch current, the latter desaturates and develops voltage within the bus voltage range. The desaturation protection circuits 70a, 70b detect the increased collector-emitter voltage when it is above a predefined threshold and send a signal to the gate driver/controller 9 to turn-off the switch.

Figure 6:
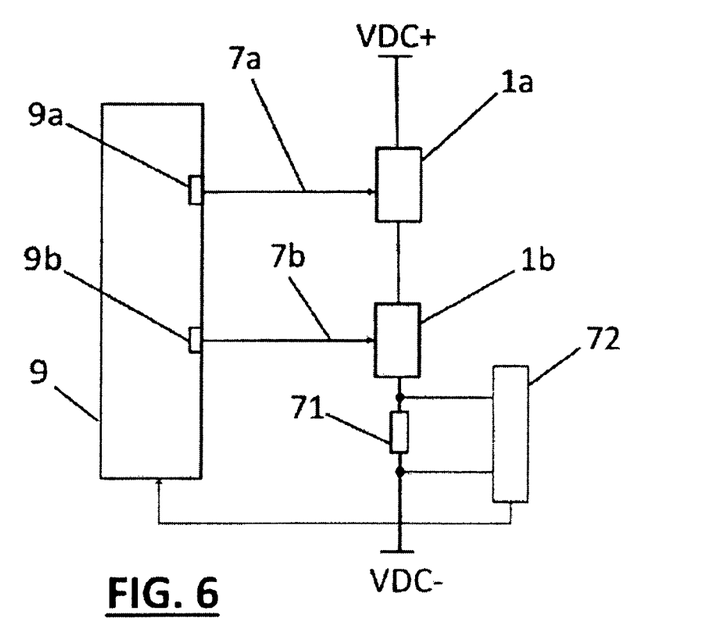
FIG. 6 is a schematic view of a converter block with current detection means.

FIG. 6 concerns a current sense resistor 71 in the power line of the switches 1a, 1b and a voltage detector 72 that senses the voltage at the resistor connections.

When shoot-though current occurs, the corresponding large voltage is detected across the sense resistor and if larger than a predetermined threshold, a signal is sent to the gate/driver controller to turn-off both switches in the block.

When the shoot-through test is conduced, if no desaturation is detected by the desaturation sensing means, this means that no shoot-through current flows implying that there is open-circuit fault in a respective switch. Assuming that the protection feature of the gate driver operates correctly, the block where an open-circuit fault exists can be identified and localized. The shoot-through tests can be executed at suitable occasions such as power-up and power-down of the modular inverter or GPI, or even on-line, as the test duration is within microseconds and causes no disruption of the regular modular inverter operation or undue stress on the switches.

As said before, other means of detecting shoot-through current can be utilized such as current sense resistor in the half-bridge. It should be noted that there remains a possibility that the detected fault comes from a failure in a drive circuit of the switches. However, the probability of such a failure is much lower than an open circuit fault in a block so the efficiency of the present method is high.

For open-circuit diagnostics of a whole modular inverter the method needs to be implemented separately on each phase leg and each block of such phase leg is addressed. Self-diagnostics can however run independently and simultaneously on all of the inverter's phase legs since no data need to be exchanged between the diagnostic algorithms of different phase legs.

With respect to the detection of abnormal temperature in a block, a self-diagnostic method may include the following sub-procedures.

Figure 3:
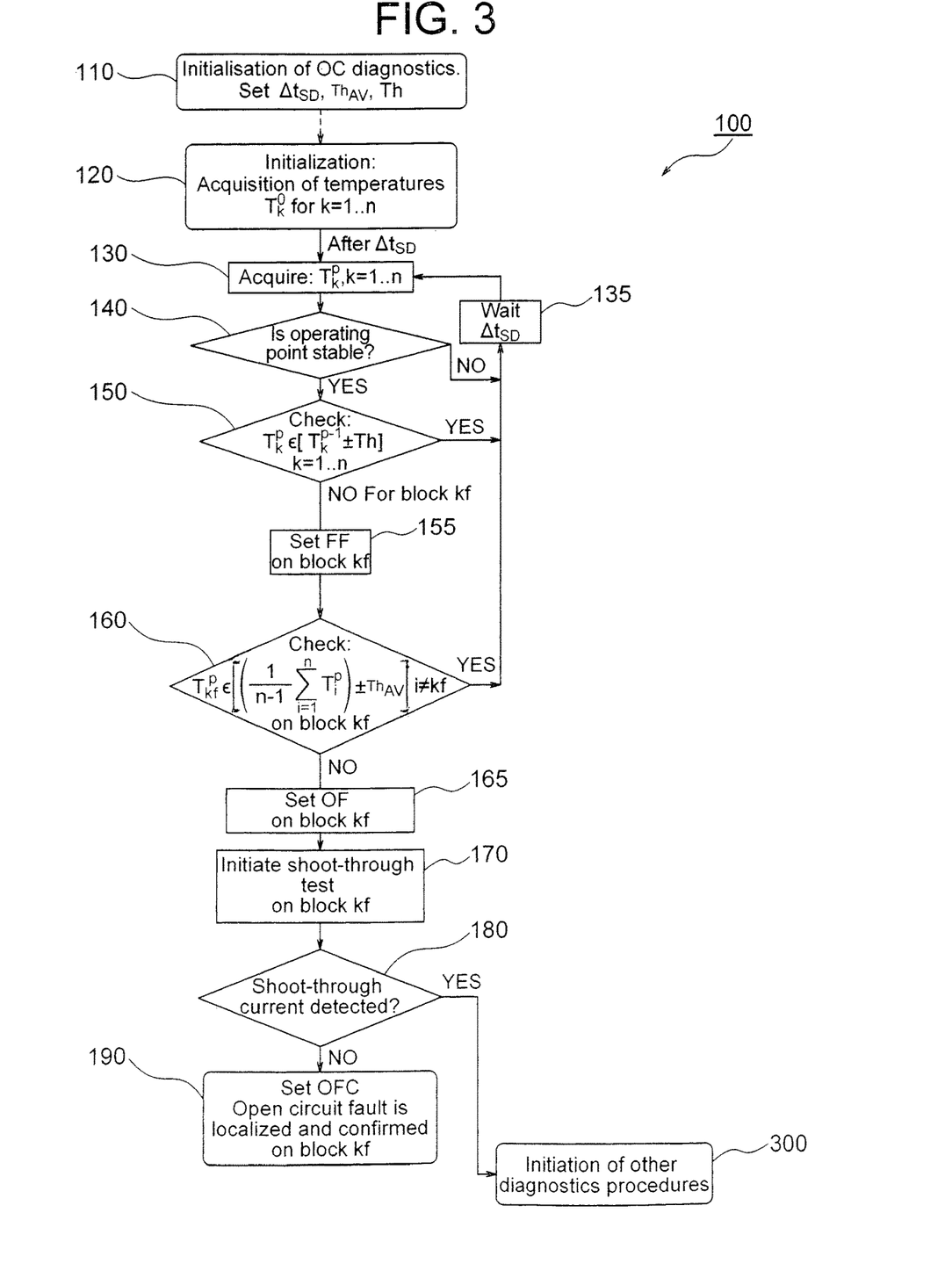
FIG. 3 is a flowchart of a first disclosed process.
Figure 4:
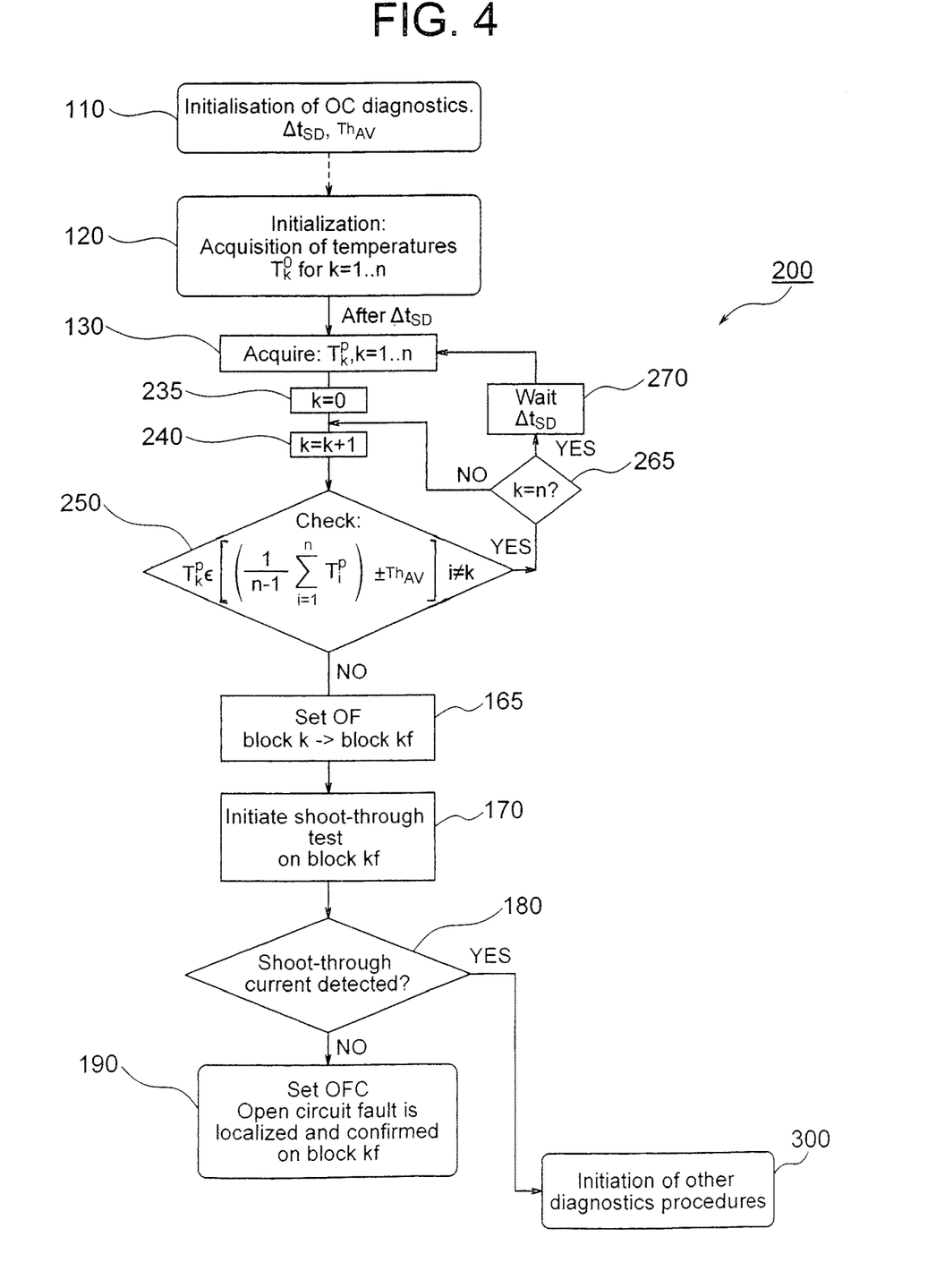
FIG. 4 is a flowchart of a second disclosed process.

A first sub procedure present both in FIG. 3 and FIG. 4 is an initialization of the measurement procedure. During this sub-procedure 120 the initial temperature values of the blocks are acquired for all blocks in the concerned phase leg and self-diagnosis is started. This initialization can be performed immediately after power-up of the inverter or after predefined time interval after powering-up the inverter or in special time period dedicated just to modular inverter fault self-detection. In this sub procedure, the initial temperature is measured for all n blocks that are paralleled in a phase leg.

$T_k^0$ for k=1 . . . n.

where T is the block temperature, k the block number between 1 and n the number of blocks in the leg. The temperature data can be stored in short-term data storage of the controller 9 of FIG. 2.

A second sub procedure 130 is an acquisition of temperature signals at sampling intervals. This sub-procedure is active continuously during the inverter operation. The algorithm is executed at time instances defined with sampling interval $\Delta t_{SD}$.

In a p-th sampling at $t_{SD}^p$, the temperatures: $T_k^p$ for k=1 . . . n are measured in each block of the n blocks that are paralleled in the phase leg. Temperature data is stored in short-term data storage. The data $T_k^{p-2}$, k=1 . . . n can be deleted from short-term data storage.

In a first embodiment object of FIG. 3.

A third sub procedure is a first type of monitoring for indications of possible fault can be executed when a test 140 confirms that the operating point is stable that is the phase current is stable. This monitoring will then be executed continuously during the inverter stable operation at time instances defined with sampling interval $\Delta t_{SD}$ 135 until a fault is found.

For each block in a phase leg this sub-procedure checks in test 150 if the block temperature is different from its temperature measured in a previous step for more than a predefined temperature deviation threshold Th.

The fault is possible if following condition is not fulfilled:

$T_k^p \in [T_k^{p-1} \pm Th]$ where Th is predefined temperature deviation threshold.

In case the condition is not fulfilled for a block then a possible fault flag FF is set at step 155 for such block kf, then a fourth sub-procedure 160 is activated. In this sub-procedure 160, the temperature of the bock kf having the possible fault flag is compared to the average temperature of all other paralleled blocks of the leg. If the temperature of block kf differs from the temperature of other parallel blocks for more than predefined average temperature deviation threshold, then the fault is confirmed and a flag OF is set at step 165.

Thus the fault on block kf is confirmed if following condition is not fulfilled:

$$T_{kf}^p \in \left[\left(\frac{1}{n-1}\sum_{i=1}^{n}T_i^p\right) \pm Th_{AV}\right], i \neq k$$

Where $Th_{AV}$ is a predefined average temperature deviation threshold.

In a second embodiment object of FIG. 4.

The third and fourth sub-procedures may be replaced by a fifth sub-procedure 240, 250, 265 which compares the temperature of each block to the average temperature of all other paralleled blocks continuously at each sampling time $t_{SD}^p$. This procedure can be summarized as:

$$T_k^p \in \left[\left(\frac{1}{n-1}\sum_{i=1}^{n}T_i^p\right) \pm Th_{AV}\right], i \neq k$$

for $\forall k$, where k=1 . . . n number of block and where $Th_{AV}$ is predefined average temperature deviation threshold.

If the condition is not fulfilled for a kf block, then a fault has been detected in that block and a flag OF is set at step 165. Such procedure which in appearance is simpler than the third and fourth sub procedures necessitates however more calculation power and memory size than these third and fourth sub procedures. The fifth sub procedure that compares each block with the mean value of other blocks of a phase leg may be used in case of computationally powerful controller or used only at specific times such as power up to detect a faulty block from the start of operation or at power down to detect a block that becomes faulty under power down operations.

A sixth sub-procedure 170, 180 which is the same in the two realizations modes of FIGS. 3 and 4 consists in an open-circuit fault identification and localization. This sub-procedure is executed only after fault has been detected either using the third and fourth sub-procedures or the fifth sub procedure. It is used to determine if the fault is really an open-circuit fault or some other fault. For this procedure, it is assumed that the drive circuit is operating correctly.

The shoot-through routine can be performed periodically; however this can stress the power dies and their interface and it may be preferable to perform such only in case a fault is detected with the fault detection method based on temperature survey.

Once a fault is detected, the shoot-through test is necessary to identify and localize an open-circuit fault. The shoot-through is triggered by the gate signals of corresponding half-bridge by driving to on-state both switches for a duration longer than the commutation time of the switches but still within the device Safe Operating Area (usually below 10 μs).

If no shoot-through is detected by the protection circuit (desaturation circuit or other shoot-through detection circuit) which is a standard feature in inverter driving circuits, this means that there is open-circuit fault of one or both of switches in the tested block. Such identification of open-circuit fault is very accurate and the confirmed open circuit fault flag OFC can be raised at step 190.

If a shoot-through is detected, then the fault is not an open-circuit fault. Consequently, in such case, other procedure(s) 300 for fault identification of other faults which are not the object of the present disclosure need to be initiated.

Parameters used in open-circuit diagnostic method algorithm.

Considerations at selecting sampling interval $\Delta t_{SD}$.

What should be considered is the time necessary that change of device power losses will reflect in change of temperature measured by temperature sensing device installed on the block. If the sampling time is too low, then change of power loss will not fully reflect in the measured temperature. Consequently, the diagnostic algorithm will not be effective.

Prior to these procedures, an initialization step 110 of relevant parameters such as $\Delta t_{SD}$ the sampling interval, Th and $Th_{AV}$ the temperature thresholds to be used should be done at manufacture of the inverter or at some initialization point with memorization in nonvolatile memory of the data.

The information that should be considered for determining $\Delta t_{SD}$ is the thermal impedance between each switch and the temperature sensing device. The thermal impedance depends on the properties of the power electronic materials used in the block and the relative position of the switches with regards to the temperature sensing device.

The thermal impedance between ii switch and the temperature sensing device in the block can be modelled as partial-fraction circuit, also known as Foster model. The parameters of the model can be determined by FEM simulation or experimentally. This Foster model can be for example a first order circuit composed of parallel-connected thermal resistance $R_{th,i}$ and thermal capacitance $C_{th,i}$ between the i-th switch and the temperature sensing device. Hereby it is assumed that the thermal capacitance of the temperature sensing device can be neglected. For this example, the time necessary for temperature sensing device to detect temperature change due to changed losses on the $i_{th}$ switches is:

$$t_{detect,i} = 5 \cdot R_{th,i} \cdot C_{th,i} = 5 \cdot \tau_i$$

Consequently, for the sampling interval $\Delta t_{SD}$, the following condition should be adopted permitting that the change of operation of all switches in the module would reflect in change of temperature measured by the temperature sensing device:

$$\Delta t_{SD} > \max(t_{detect,i}), i = 1 \ldots n$$

where n is total number of semiconductor switches in the module.

Considerations at selecting temperature deviation threshold Th.

Small variations in measured block temperature can be expected in healthy block at two subsequent measuring instances even in the stable operating point. Those small variations are not indication of a fault. Examples of possible causes:
- other power electronic components positioned in the neighborhood of the block that have changed their temperature can influence the block temperature;
- changed ambient temperature;
- noise in measured signals.

Suitable value of Th can be determined experimentally during operation of healthy inverter under constant operating conditions (constant refers to operation point of inverter) and measuring the temperature of specific block at number of instances. Such set of measurements at predefined operating point can be repeated for different ambient temperatures. Further another sets of measurements can be conducted at different operating points of the inverter, each set also for different ambient temperatures.

Th can be then selected to accommodate all temperature variations of healthy blocks observed during those experiments.

Considerations at selecting average temperature deviation threshold $Th_{AV}$.

There is always some small mismatch between the blocks due to the electrical and mechanical unbalances that origin from material variations and tolerances at the production and mounting. The consequence of this mismatch is variations in power dissipation between the paralleled blocks which will reflect in small discrepancies between their temperatures. Also different blocks may have different cooling conditions due to their position and non-uniform cooling.

Temperature deviation threshold $Th_{AV}$ is introduced to accommodate this mismatch between the blocks. Suitable value can be determined experimentally by operating healthy inverter under different operating conditions and measuring the temperature of all blocks. With this expected variations of measured temperatures can be determined. The parameter can be set accordingly and will assure that small mismatch between the blocks will not cause false fault detection alarm.

Power electronic modules can due to the aging processes, especially when exposed to high stress, also significantly change their thermal properties. Furthermore the characteristics of temperature sensing device may change with the aging as well. Therefore it may be necessary to occasionally repeat the procedures for determining a suitable sampling interval $\Delta t_{SD}$, temperature deviation threshold Th and average temperature deviation threshold $Th_{AV}$ to accommodate those changes.

This permits to proceed to calibration procedures to determine suitable sampling interval $\Delta t_{SD}$, temperature deviation threshold Th and average temperature deviation threshold $Th_{AV}$. These calibration procedures may be initiated in adjustable time intervals (depending on the components and usage of the modular inverter or GPI) during life of the inverter as the characteristics and thermal properties of power electronic modules and temperature sensing devices may vary due to the aging processes, especially when exposed to high stress.

The complete detection process can then be based either on:
- a detection procedure A such as the example in FIG. 3 based on a detection of sudden change of temperature on one block that compares the current temperature of each block subtracted to its temperature at a previous step with a fixed temperature deviation threshold. This procedure is quick and needing minimum calculation power but needing detection of stable operation and a confirmation through a comparison of the varying block temperature with the average temperature of the other blocks to confirm possibility of a fault;

or
- a detection procedure B such as the example in FIG. 4 where the temperature of each block is subtracted to the average of the temperatures of all other blocks and compared to an average temperature deviation threshold at each steps. This procedure which compares the temperature of all blocks of a leg to the average temperature of the other blocks of such leg needs more calculation power but does not need a further confirmation step.

In any case, a subsequent shoot-through test will allow a confirmation of the high probability of an open-circuit fault.

It should be noted that the detection procedure A needs also to check for blocks that remain cold from the beginning of the operations and do not vary. Therefore if procedure A is selected as continuous diagnostic procedure then a special provision is necessary to detect the module which has open-circuit fault already at powering-up of the inverter. For this, procedure B may be executed only one time (without element 270). The procedure B can be in this case executed any time after power-up or inverter and before beginning of continuous online diagnostics following procedure A.

The procedures described above for one leg of an inverter are repeated for the other legs of the inverter.

The invention is not limited the disclosed embodiments and in particular, the sub-procedures 3, 4 and 5 may be used in a same modular inverter at different times according to specific working conditions.

The invention claimed is:

1. Self-diagnostic method of open-circuit faults, said method comprising a first loop comprising:
    sampling, by a modular inverter configured to drive a three phase motor, power switching blocks of the modular inverter comprising a plurality (k=1 ... n) of blocks paralleled in a phase leg, and each of the plurality of blocks including a temperature sensor among a plurality of temperature sensors, temperatures data $T_k^p$ of said n blocks (k=1 ... n) in a phase leg measured by said plurality of temperature sensors at relevant sampling times $t_{SD}$ with a relevant sampling interval $\Delta t_{SD}$, and storing the sampled temperatures data $T_k^p$;
    at least one step of comparing current temperature data $T_k^p$ of a block k with current average temperature data $$\left(\frac{1}{n-1}\sum_{i=1}^{n}T_i^p\right)$$

of all other blocks of said phase leg at sampling time $t_{SD}^P$, considering said block k as an open circuit block block kf and raising an open-circuit fault flag OF on said open circuit block kf if the following condition is not fulfilled:

$$T_k^p \in \left[\left(\frac{1}{n-1}\sum_{i=1}^{n}T_i^p\right) \pm Th_{AV}\right], i \neq k$$

where $Th_{AV}$ is a predefined average temperature deviation threshold.

2. Self-diagnostic method according to claim 1 wherein said step of comparing current temperature data $T_k^p$ of a block k with current average temperature data is done on blocks k=1 to n until a fault flag OF is raised on a faulty block kf.

3. Self-diagnostic method according to claim 1 comprising a second loop embedded in said first loop, said second loop comprising, at sampling time $t_{SD}^P$ comparing said temperature data $T_k^p$ of each block k with previously sampled and stored temperature data $T_k^{p-1}$ of said each block k and raising a possible fault flag FF on a faulty block kf if the following condition is not fulfilled:

$$T_k^p \in [T_k^{p-1} \pm Th]$$

where Th is a predefined temperature deviation threshold, and wherein said comparing current temperature data $T_k^p$ of a block k with current average temperature data $$\left(\frac{1}{n-1}\sum_{i=1}^{n}T_i^p\right)$$

of other blocks in said phase leg, considering said block k as an open circuit block kf and raising an open-circuit fault flag OF on said open circuit block kf if the following condition is not fulfilled:

$$T_k^p \in \left[\left(\frac{1}{n-1}\sum_{i=1}^{n}T_i^p\right) \pm Th_{AV}\right], i \neq k$$

where $Th_{AV}$ is a predefined average temperature deviation threshold is done on said faulty block kf.

4. Self-diagnostic method according to claim 3, comprising a third loop of awaiting a stable operating point before comparing said sampled temperature $(T_k^P)$ of each (k) block (k=1 ... n) at a sampling time $t_{SD_k}^P$ with the temperature $(T_k^{P-1})$ of a same (k) block at a previous sampling time $t_{SD_k}^{P-1}$ as said stable operating point.

5. Self diagnostic method according to claim 3 wherein in case $$T_k^p \in \left[\left(\frac{1}{n-1}\sum_{i=1}^{n}T_i^p\right) \pm Th_{AV}\right], i \neq k$$

is fulfilled for block kf the method comprises waiting $\Delta t_{SD}$ and repeating said first loop.

6. Self-diagnostic method according to claim 1 wherein in case $T_k^p \in [T_k^{p-1} \pm Th]$ is fulfilled for blocks k=1 to n the method comprises waiting $\Delta t_{SD}$ and repeating said first loop.

7. Self-diagnostic method according to claim 1, comprising an initialization process wherein initial temperature values $(T_k^0, k=1 ... n)$ are measured and stored for all n blocks that are paralleled in said phase leg after power-up of the modular inverter or after a predefined time interval after powering-up of the modular inverter or in special time period dedicated to the modular inverter fault self-detection.

8. Self-diagnostic method according to claim 1, comprising deleting previous temperature data stored at a sampling time $t_{SD_k}^{p-2}$ while storing $T_k^p$ temperature values.

9. Self-diagnostic method according to claim 1 were the sampling interval $\Delta t_{SD}$ is set as being greater than the largest thermal time constant of relevant thermal time constants in the modular inverter blocks, said method comprising calibration procedures to determine a suitable sampling interval $\Delta t_{SD}$, a suitable temperature deviation threshold Th and a suitable average temperature deviation threshold $Th_{AV}$, and comprising an initialisation procedure with said sampling interval $\Delta t_{SD}$, temperature deviation threshold Th and average temperature deviation threshold $Th_{AV}$.

10. Self-diagnostic method according to claim 1, wherein, said blocks comprising a top switch and a bottom switch and shoot-through sensing means for each of said switches, said open circuit fault detection procedure comprises identifying and localizing the fault through triggering a shoot-through test by driving to on-state both top switch and bottom switch of a block on which an open circuit flag OF is raised with a drive circuit of said block for a duration longer than the commutation time of the switches, but within the safe operating area of said switches, and, testing presence of shoot-through current and raising a confirmed open circuit fault flag OFC on said one of said blocks in case no shoot-through current is detected and wherein in case shoot through current is detected when testing presence of shoot-through current, other diagnostic procedures are initiated.

11. Self-diagnostic method comprising repeating the procedures according to claim 1 for each leg of said converter.

12. Self-diagnostic method according to claim 1 comprising transmitting fault detection information FF and/or OF, and/or OFC to a remote survey computer.

13. Computerized survey system for implementing the self-diagnostic method according to claim 1 comprising a processor, program memory comprising programs implementing said method, data memory for storing and processing temperature values, fault detection data and program data, connecting lines with said plurality of temperature sensors for transmitting temperature measurements to said computerized system, comprising connecting lines with said shoot-through detection means and control lines connected with a drive block or drive blocks of the modular inverter.

14. Modular inverter comprising an inverter electronic control unit wherein the computerized survey system according to claim 13 is incorporated in said control unit.

15. Self-diagnostic method of open-circuit faults, in power switching blocks of a modular inverter comprising a plurality (k=1 ... n) of blocks paralleled in a phase leg, and being provided with temperature sensors, said method comprising a first loop comprising:

sampling, by the modular inverter, temperatures data $T_k^p$ of said n blocks (k=1 ... n) in a phase leg measured by said temperature sensors at relevant sampling times $t_{SD}$ with a relevant sampling interval $\Delta t_{SD}$, and storing the sampled temperatures data $T_k^p$;

at least one step of comparing current temperature data $T_k^p$ of a block k with current average temperature data $$\left(\frac{1}{n-1}\sum_{i=1}^{n} T_i^p\right)$$

of all other blocks of said phase leg at sampling time $t_{SD}^P$, considering said block k as an open circuit block block kf and raising an open-circuit fault flag OF on said open circuit block kf if the following condition is not fulfilled:

$$T_k^p \in \left[\left(\frac{1}{n-1}\sum_{i=1}^{n} T_i^p\right) \pm TH_{AV}\right], i \neq k$$

where $Th_{AV}$ is a predefined average temperature deviation threshold, and the method further comprising replacing the block kf with the raised open-circuit fault flag OF.

\* \* \* \* \*